US012757572B2

(12) United States Patent
Sun et al.

(10) Patent No.: US 12,757,572 B2
(45) Date of Patent: Oct. 6, 2026

(54) ORGANIC LIGHT EMITTING TRANSISTOR COMPRISING MICRO-NANO GRATING STRUCTURE AND PREPARATION METHOD THEREOF

(71) Applicant: BOE Technology Group Co., Ltd., Beijing (CN)

(72) Inventors: Mengna Sun, Beijing (CN); Juan Zhang, Beijing (CN); Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 552 days.

(21) Appl. No.: 18/271,249

(22) PCT Filed: Feb. 24, 2022

(86) PCT No.: PCT/CN2022/077752
§ 371 (c)(1),
(2) Date: Jul. 7, 2023

(87) PCT Pub. No.: WO2023/159435
PCT Pub. Date: Aug. 31, 2023

(65) Prior Publication Data

US 2024/0397746 A1 Nov. 28, 2024

(51) Int. Cl.
*H10K 50/30* (2023.01)
*H10H 20/00* (2025.01)
(Continued)

(52) U.S. Cl.
CPC ........... *H10K 50/30* (2023.02); *H10H 20/062* (2025.01); *H10K 50/85* (2023.02); *H10K 71/60* (2023.02)

(58) Field of Classification Search
None
See application file for complete search history.

(56) References Cited

U.S. PATENT DOCUMENTS 8,008,656 B2 8/2011 Nakamura et al.
2009/0315043 A1 12/2009 Nakamura et al.
(Continued)

FOREIGN PATENT DOCUMENTS

CN 101159307 A 4/2008
CN 102709310 A 10/2012
(Continued)

OTHER PUBLICATIONS

International Search Report and Written Opinion issued on Nov. 23, 2022, in corresponding International Application No. PCT/CN2022/077752, 32 pages.
(Continued)

*Primary Examiner* — Daniel Whalen
(74) *Attorney, Agent, or Firm* — XSENSUS LLP

(57) ABSTRACT

The present disclosure relates to an organic light emitting transistor, a display panel and a display apparatus. At least part of a first micro-nano grating structure is provided on a side of the electron transport layer away from the base substrate, such that at least part of a second micro-nano grating structure is provided on a side of the first electrode away from the base substrate. The first micro-nano grating structure and the second micro-nano grating structure can reduce the wave vector in the waveguide effect plane, thus effectively reducing the wave vector in the plane. When the wave vector in the plane is smaller than the wave vector in the free space, the plasma mode will be excited to convert into an emittable mode, thus effectively extracting the emitted light.

15 Claims, 5 Drawing Sheets

(51) Int. Cl.
*H10K 50/85* (2023.01)
*H10K 71/60* (2023.01)

(56) References Cited

U.S. PATENT DOCUMENTS

| | | | | |
|---|---|---|---|---|
| 2012/0224148 | A1 | 9/2012 | Natsumeda et al. | |
| 2017/0162818 | A1 | 6/2017 | Kijima | |
| 2020/0035953 | A1* | 1/2020 | Chen | H10K 71/621 |

FOREIGN PATENT DOCUMENTS

| | | | |
|---|---|---|---|
| CN | 104335679 | A | 2/2015 |
| CN | 102709310 | B | 4/2016 |
| CN | 109659389 | A | 4/2019 |
| CN | 110649133 | A | 1/2020 |
| CN | 111211248 | A | 5/2020 |
| CN | 111384287 | A | 7/2020 |
| CN | 111785839 | A | 10/2020 |
| CN | 113270468 | A | 8/2021 |
| CN | 114023894 | A | 2/2022 |

OTHER PUBLICATIONS

The First Office Action mailed Jul. 27, 2025, in Chinese Application No. 202280000276.2, 22 pages including English translation.

* cited by examiner

ORGANIC LIGHT EMITTING TRANSISTOR COMPRISING MICRO-NANO GRATING STRUCTURE AND PREPARATION METHOD THEREOF

TECHNICAL FIELD

The present disclosure is a U.S. National Stage of International Application No. PCT/CN2022/077752, filed on Feb. 24, 2022, which relates to the field of display technology and, more specifically, to an organic light emitting transistor and preparation method thereof, display panel, and display apparatus.

BACKGROUND

The organic light emitting transistor (OLET) integrates the switching function of an organic field effect transistor (OFET) with the electroluminescence function of an organic light emitting diode (OLED). The OLET has characteristics of simple structure, thinness and lightness, being easy to miniaturize and other characteristics, which becomes one of the future development trends of display technology.

It is noted that the information disclosed in the background technology section above is intended only to enhance the understanding of the background of the present disclosure and may therefore include information that does not constitute prior art known to those of ordinary skill in the art.

SUMMARY

The present disclosure provides an organic light emitting transistor and a preparation method thereof, a display panel, and a display apparatus.

According to an aspect of the present disclosure, there is provided an organic light emitting transistor, including: a base substrate, an active layer, a hole transport layer, a light emitting layer, an electron transport layer and a first electrode. The active layer is provided on a side of the base substrate. The hole transport layer is provided on a side of the active layer away from the base substrate. The light emitting layer is provided on a side of the hole transport layer away from the base substrate. The electron transport layer is provided on a side of the light emitting layer away from the base substrate, wherein at least part of a first micro-nano grating structure is provided on a side of the electron transport layer away from the base substrate. The first electrode is provided on a side of the electron transport layer away from the base substrate, wherein at least part of a second micro-nano grating structure is provided on a side of the first electrode away from the base substrate, an orthographic projection of the second micro-nano grating structure on the base substrate is located within an orthographic projection of the first micro-nano grating structure on the base substrate.

In an embodiment of the present disclosure, a first region and a second region spaced apart are provided on a side of the electron transport layer away from the base substrate, the first micro-nano grating structure is located in the first region, the first electrode is provided on the first micro-nano grating structure, the second region is provided with a third micro-nano grating structure, the organic light emitting transistor further includes: a second electrode, provided on the third micro-nano grating structure, wherein a fourth micro-nano grating structure is provided on a side of the second electrode away from the base substrate, an orthographic projection of the fourth micro-nano grating structure on the base substrate is located within an orthographic projection of the second micro-nano grating structure on the base substrate.

In an embodiment of the present disclosure, a region of the electron transport layer away from a side of the base substrate and located between the first electrode and the second electrode is a planar region.

In an embodiment of the present disclosure, the first micro-nano grating structure, the second micro-nano grating structure, the third micro-nano grating structure and the fourth micro-nano grating structure are all periodic micro-nano grating structures, the periodic micro-nano grating structure includes a plurality of mutually parallel bar-shaped grooves, widths of the bar-shaped grooves are equal and intervals between two adjacent grooves are equal.

In an embodiment of the present disclosure, the bar-shaped groove has a rectangular or curved cross-sectional shape along a direction perpendicular to an extension direction of the bar-shaped groove.

In an embodiment of the present disclosure, in response to that the bar-shaped groove has a rectangular cross-sectional shape, the bar-shaped groove has a width of 200-600 nm and a depth of 10-50 nm, and the interval between two adjacent bar-shaped grooves is 5-50 nm.

In an embodiment of the present disclosure, the first micro-nano grating structure, the second micro-nano grating structure, the third micro-nano grating structure and the fourth micro-nano grating structure are all periodic micro-nano grating structures, the periodic micro-nano grating structure includes a plurality of dotted recessed portions arranged in an array.

In an embodiment of the present disclosure, the organic light emitting transistor further includes a first gate, provided between the base substrate and the active layer, wherein a first insulating layer is provided between the first gate and the active layer.

In an embodiment of the present disclosure, the organic light emitting transistor further includes a second gate, provided between the first insulating layer and the active layer, wherein a second insulating layer is provided between the second gate and the active layer.

In an embodiment of the present disclosure, the organic light emitting transistor further includes an encapsulation layer, provided on a side of the first electrode and the second electrode away from the base substrate, wherein the encapsulation layer is partially located on the second micro-nano grating structure, partially located on the fourth micro-nano grating structure, and partially located on a planar region of the electron transport layer.

In an embodiment of the present disclosure, the organic light emitting transistor further includes a first gate, provided on a side of the second electrode and the first electrode away from the base substrate, wherein a first insulating layer is provided between the first gate and the second electrode, the first electrode, the first insulating layer is partially provided on the second micro-nano grating structure, partially provided on the fourth micro-nano grating structure and partially provided on a planar region of the electron transport layer.

In an embodiment of the present disclosure, the organic light emitting transistor further includes an encapsulation layer, provided on a side of the first gate away from the base substrate and in contact with the first gate.

In an embodiment of the present disclosure, the first micro-nano grating structure is provided on an entire surface of the electron transport layer, the first electrode is provided on the first micro-nano grating structure, the organic light emitting transistor further includes: a second electrode, provided between the base substrate and the active layer; a first gate, provided between the second electrode and the base substrate, wherein a first insulating layer is provided between the first gate and the second electrode.

In an embodiment of the present disclosure, the organic light emitting transistor further includes a second gate, provided between the first insulating layer and the second electrode, wherein a second insulating layer is provided between the second gate and the second electrode.

In an embodiment of the present disclosure, the organic light emitting transistor further includes: an encapsulation layer, provided on a side of the first electrode away from the base substrate and located on the first micro-nano grating structure.

According to another aspect of the present disclosure, there is provided a method of preparing an organic light emitting transistor, including:

providing a base substrate;
forming an active layer on a side of the base substrate;
forming a hole transport layer on a side of the active layer away from the base substrate;
forming a light emitting layer on a side of the hole transport layer away from the base substrate;
forming an electron transport layer on a side of the light emitting layer away from the base substrate;
forming at least part of a first micro-nano grating structure on a side of the electron transport layer away from the base substrate; and
forming a first electrode in a region of the electron transport layer provided with the first micro-nano grating structure, wherein at least part of a second micro-nano grating structure is provided on a side of the first electrode away from the base substrate, an orthographic projection of the second micro-nano grating structure on the base substrate is located within an orthographic projection of the first micro-nano grating structure on the base substrate.

According to still another aspect of the present disclosure, there is provided a display panel, including the organic light emitting transistor of an aspect of the present disclosure.

According to yet still another aspect of the present disclosure, there is provided a display apparatus, including the display panel of another aspect of the present disclosure.

It should be understood that the above general description and the following detailed description are only exemplary and explanatory and do not limit the present disclosure.

BRIEF DESCRIPTION OF THE DRAWINGS

The accompanying drawings herein are incorporated into and form part of the specification, illustrate embodiments consistent with the present disclosure, and are used in conjunction with the specification to explain the principles of the present disclosure. It will be apparent that the accompanying drawings in the following description are only some embodiments of the present disclosure, and that other accompanying drawings may be obtained without creative effort by a person of ordinary skill in the art in accordance with these accompanying drawings.

THE NUMERAL REFERENCES

Figure 1:
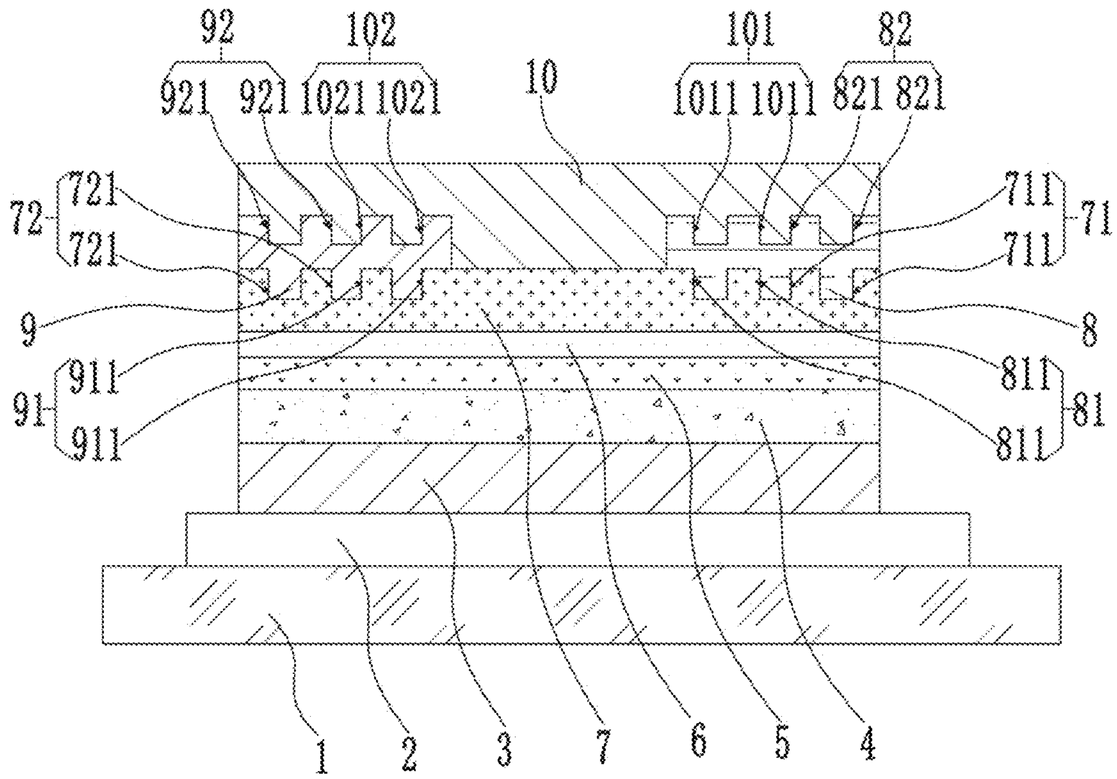
FIG. 1 is a schematic diagram of a structure of an organic light emitting transistor involved in an embodiment of the present disclosure.

1, base substrate; 2, first gate; 3, first insulating layer; 4, active layer; 5, hole transport layer; 6, light emitting layer; 7, electron transport layer, 71, first micro-nano grating structure, 711, first bar-shaped groove, 72, third micro-nano grating structure, 721, third bar-shaped groove; 8, first electrode, 81, fifth micro-nano grating structure, 811, fifth ridge, 82, second micro-nano grating structure, 821, second bar-shaped groove; 9, second electrode, 91, seventh micro-nano grating structure, 911, seventh ridge, 92, fourth micro-nano grating structure, 921, fourth bar-shaped groove; 10, encapsulation layer, 101, sixth micro-nano grating structure, 1011, sixth ridge, 102, eighth micro-nano grating structure, 1021, eighth ridge; 11, second gate; 12, second insulating layer; 13, imprint template; 131, imprint pattern, 1311, strip-shaped imprint groove.

DETAILED DESCRIPTION

Example embodiments will now be described more fully with reference to the accompanying drawings. However, the example embodiments can be implemented in a variety of forms and should not be construed as being limited to the embodiments set forth herein; rather, the provision of these embodiments allows the present disclosure to be comprehensive and complete and conveys the ideas of the example embodiments in a comprehensive manner to those skilled in the art. The same numeral references in the drawings indicate identical or similar structures, and thus their detailed description will be omitted. Furthermore, the accompanying drawings are only schematic illustrations of the present disclosure and are not necessarily drawn to scale.

Although relative terms such as “above” and “below” are used in this specification to describe the relative relationship of one component of an icon to another, these terms are used in this specification only for convenience, for example, according to the orientation of the examples described in the accompanying drawings. It will be understood that if the device of the icon is turned so that it is upside down, the component described as being “above” will become the component described as being “below”. When a structure is “above” other structure, it may mean that a structure is integrally formed on other structure, or that a structure is set "directly" on other structure, or that a structure is set "indirectly" on other structure through another structure.

The terms "a", "an", "the", "said" and "at least one" are used to indicate the presence of one or more elements/components/etc.; the terms "including" and "having" are used to indicate an open-ended inclusion and refer to the presence of additional elements/components/etc. in addition to those listed elements/components/etc.; the terms "first", "second" and "third" are used only as marks and not as limitations on the number of objects.

The external quantum efficiency (EQE) of conventional organic light emitting transistors (OLETs) is still severely limited by the low light extraction efficiency, facing internal energy losses in the waveguide mode, substrate mode and surface plasma mode. As a result, only about 20% of the photons can be extracted from inside of the OLET, which greatly limits the prospect of its commercial application. In the related art, the waveguide mode and the substrate modes often adopt other materials that can replace the Indium Tin Oxide (ITO) to improve the internal energy loss of OLETs. Therefore, the internal energy loss caused by the surface plasma mode of OLETs becomes an urgent problem to be solved.

At room temperature and room pressure, a large number of free electrons in the free state is present inside and on the surface of a metal, forming a free electron cluster, known as a plasma. The surface plasma is a special electromagnetic mode that metals and other materials are at the interface. The wave vector of a surface plasma mode is generally larger than the wave vector of light at the same frequency, therefore, electrons in this mode usually propagate only at the surface of the metal. Due to the heat loss effect in metals at room temperature, electrons of the surface plasma mode can only travel a limited distance and the continuous fluctuation of electrons at the metal interface is called surface plasma oscillation. For a continuous metal interface, the surface plasma mode is a non-radiation mode when the light wave vector is smaller than the wave vector of the surface plasma. In OLETs, the inevitable use of metals as electrodes means that there will inevitably be an interface between metals and other media, resulting in surface plasma mode losses at the interface.

Based on this, example embodiments of the present disclosure provide an organic light emitting transistor. As shown in FIGS. 1 to 9, the organic light emitting transistor includes a base substrate 1, an active layer 4, a hole transport layer 5, a light emitting layer 6, an electron transport layer 7 and a first electrode 8. The active layer 4 is provided on a side of the base substrate 1. The hole transport layer 5 is provided on a side of the active layer 4 away from the base substrate 1. The light emitting layer 6 is provided on a side of the hole transport layer 5 away from the base substrate 1. The electron transport layer 7 is provided on a side of the light emitting layer 6 away from the base substrate 1. At least part of a first micro-nano grating structure 71 is provided on a side of the electron transport layer 7 away from the base substrate 1. The first electrode 8 is provided on a side of the electron transport layer 7 away from the base substrate 1. At least part of a second micro-nano grating structure 82 is provided on a side of the first electrode 8 away from the base substrate 1. An orthographic projection of the second micro-nano grating structure 82 on the base substrate 1 is located within an orthographic projection of the first micro-nano grating structure 71 on the base substrate 1.

In OLETs, the inevitable use of metallic materials for manufacturing the first electrode 8 inevitably results in the presence of surface plasma mode losses at the interface of the first electrode 8. By using the grating coupling method, at least part of a first micro-nano grating structure 71 is provided on a side of the electron transport layer 7 away from the base substrate 1, so that at least part of a second micro-nano grating structure 82 is provided on a side of the first electrode 8 away from the base substrate 1. The first micro-nano grating structure 71 and the second micro-nano grating structure 82 can effectively excite the interface between the first electrode and the other film layers to couple out light in the surface plasma mode, which can effectively reduce the energy loss inside the OLET in the surface plasma mode and improve the luminous efficiency of the OLET.

A bottom-gate organic light emitting transistor is used as an example. The first micro-nano grating structure 71 formed at the interface between the electron transport layer 7 and the first electrode 8 is used to complete the matching of the wave vector, thus realizing the light outcoupling of the surface plasma.

The specific principle is as follows: the grating period is Λ, the angle of incidence of light is α, and the conservation of momentum in the waveguide plane can be calculated from the following equation:

$$k_{\parallel} = k_0 \sin\alpha = K_{wg} \pm mK_G;$$

where $k_{\parallel}$ is the wave vector in the plane, $k_0$ denotes the wave vector in free space, $k_{wg}$ is the wave vector in the waveguide effect plane, $k_G$ is the wave vector in the first micro-nano grating structure 71, and m is an integer.

$$K_{wg} = \frac{2\pi * n_{eff}}{\lambda},\ K_G = \frac{2\pi}{\Lambda};$$

where $n_{eff}$ is the effective refractive index; λ is the outgoing wavelength.

$$n_{eff} = \left( \frac{\sum d_i}{\sum d_i / \varepsilon_i} \right)^{1/2};$$

where $\varepsilon_i$ is the dielectric constant and $d_i$ is the film thickness.

The $k_0$ for the air mode is 12 $\mu m^{-1}$, while the for the surface plasma mode is large and is 26 $\mu m^{-1}$. The surface of the first electrode 8 is provided with a first micro-nano grating structure 71, and the wave vector $k_G$ within the first micro-nano grating structure 71 can reduce the wave vector $k_{wg}$ in the waveguide effect surface, thus effectively reducing the wave vector $k_{\parallel}$ in the plane. When the wave vector $k_{\parallel}$ in the plane is smaller than the wave vector $k_0$ in the free space, the plasma mode will be excited to convert into an emittable mode, thus effectively extracting the emitted light. In this way, the energy loss caused by the OLET surface plasma mode can be effectively reduced and the luminous efficiency of the OLET can be improved.

It should be noted that the top grid type OLET mainly uses the second micro-nano grating structure 82 formed at the interface between the first electrode 8 and the first insulating layer 3 to complete the matching of the wave vector, thus realizing the light outcoupling of the surface plasma.

The structure and preparation process of the organic light emitting transistor involved in FIGS. 1 to 9 are described in detail below.

As shown in FIG. 1, the organic light emitting transistor is a bottom gate type organic light emitting transistor, including a base substrate 1. A first gate 2 is provided on a side of the base substrate 1. A first insulating layer 3 is provided on a side of the first gate 2 away from the base substrate 1. An active layer 4 is provided on a side of the first insulating layer 3 away from the base substrate 1. A hole transport layer 5 is provided on a side of the active layer 4 away from the base substrate 1. A light emitting layer 6 is provided on a side of the hole transport layer 5 away from the base substrate 1. An electron transport layer 7 is provided on a side of the light emitting layer 6 away from the base substrate 1.

A part of the region of the electron transport layer 7 away from the side of the base substrate 1 is a planar region. The planar region is located in the middle of the electron transport layer 7. A first region and a second region are provided symmetrically on two sides of the planar region. The first region is provided with a first micro-nano grating structure 71. A first electrode 8 is provided on the first micro-nano grating structure 71. A second micro-nano grating structure 82 is provided on a side of the first electrode 8 away from the base substrate 1. An orthographic projection of the second micro-nano grating structure 82 on the base substrate 1 is located within an orthographic projection of the first micro-nano grating structure 71 on the base substrate 1. The second region is provided with a third micro-nano grating structure 72. A second electrode 9 is provided on the third micro-nano grating structure 72. A fourth micro-nano grating structure 92 is provided on a side of the second electrode 9 away from the base substrate 1. An orthographic projection of the fourth micro-nano grating structure 92 on the base substrate 1 is located within an orthographic projection of the third micro-nano grating structure 72 on the base substrate 1.

An encapsulation layer 10 is provided on a side of the first electrode 8 and the second electrode 9 away from the base substrate 1. The encapsulation layer 10 is located partly on the second micro-nano grating structure 82, partly on the fourth micro-nano grating structure 92 and partly on the planar region of the electron transport layer 7.

The first micro-nano grating structure 71 includes a plurality of first bar-shaped grooves 711 distributed in parallel. Along the direction perpendicular to the extension direction of the first bar-shaped groove 711, the first bar-shaped groove 711 has a rectangular cross-sectional shape. The first bar-shaped groove 711 has a width of 200-600 nm, a depth of 10-50 nm, and an interval between two adjacent first bar-shaped grooves 711 is 5-50 nm. The fifth micro-nano grating structure 81 is formed on a side of the first electrode 8 close to the base substrate 1. The fifth micro-nano grating structure 81 includes a plurality of fifth ridges 811 distributed in parallel. The cross-sectional shape and size of the fifth ridge 811 are adapted to the cross-sectional shape and size of the first bar-shaped groove 711. That is, the fifth ridge 811 has a width of 200-600 nm, a height of 10-50 nm, and an interval between two adjacent fifth ridges 811 is 5-50 nm. The fifth ridge 811 fills in the first bar-shaped groove 711.

Figure 2:
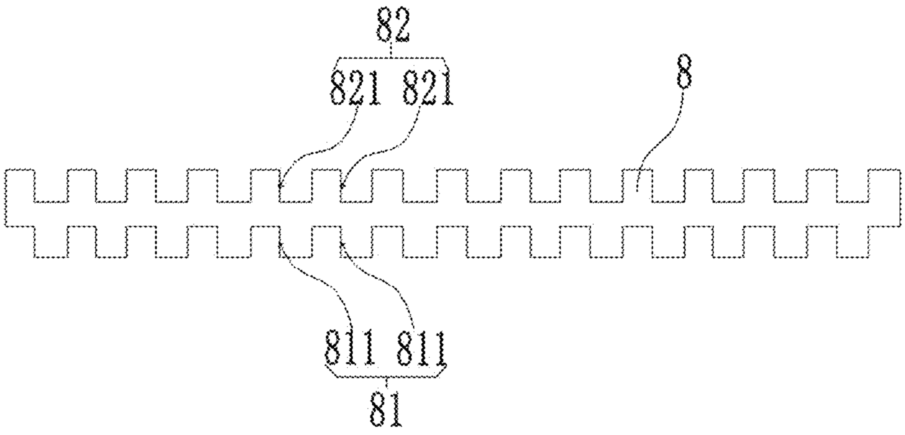
FIG. 2 is a schematic diagram of a structure of a first electrode involved in an embodiment of the present disclosure.

As shown in FIG. 2, the second micro-nano grating structure 82 includes a plurality of second bar-shaped grooves 821 distributed in parallel. Along the direction perpendicular to the extension direction of the second bar-shaped groove 821, the second bar-shaped groove 821 has a rectangular cross-sectional shape. The second bar-shaped groove 821 has a width of 200-600 nm, a depth of 10-50 nm, and an interval between two adjacent second bar-shaped grooves 821 is 5-50 nm. The sixth micro-nano grating structure 101 is formed on a side of the encapsulation layer close to the base substrate 1. The sixth micro-nano grating structure 101 includes a plurality of sixth ridges 1011 distributed in parallel. The cross-sectional shape and size of the sixth ridge 1011 are adapted to the cross-sectional shape and size of the second bar-shaped groove 821. That is, the sixth ridge 1011 has a width of 200-600 nm, a height of 10-50 nm, and an interval between two adjacent sixth ridges 1011 is 5-50 nm. The sixth ridge 1011 fills in the second bar-shaped groove 821.

The third micro-nano grating structure 72 includes a plurality of third bar-shaped grooves 721 distributed in parallel. Along the direction perpendicular to the extension direction of the third bar-shaped groove 721, the third bar-shaped groove 721 has a rectangular cross-sectional shape. The third bar-shaped groove 721 has a width of 200-600 nm, a depth of 10-50 nm, and an interval between two adjacent third bar-shaped grooves 721 is 5-50 nm. The seventh micro-nano grating structure 91 is formed on a side of the first electrode 8 close to the base substrate 1. The seventh micro-nano grating structure 91 includes a plurality of seventh ridges 911 distributed in parallel. The cross-sectional shape and size of the seventh ridge 911 are adapted to the cross-sectional shape and size of the third bar-shaped groove 721. That is, the seventh ridge 911 has a width of 200-600 nm, a height of 10-50 nm, and an interval between two adjacent seventh ridges 911 is 5-50 nm. The seventh ridge 911 fills in the third bar-shaped groove 721.

The fourth micro-nano grating structure 92 includes a plurality of fourth bar-shaped grooves 921 distributed in parallel. Along the direction perpendicular to the extension direction of the fourth bar-shaped groove 921, the fourth bar-shaped groove 921 has a rectangular cross-sectional shape. The fourth bar-shaped groove 921 has a width of 200-600 nm, a depth of 10-50 nm, and an interval between two adjacent fourth bar-shaped grooves 921 is 5-50 nm. The eighth micro-nano grating structure 102 is formed on a side of the encapsulation layer close to the base substrate 1. The eighth micro-nano grating structure 102 includes a plurality of eighth ridges 1021 distributed in parallel. The cross-sectional shape and size of the eighth ridge 1021 are adapted to the cross-sectional shape and size of the fourth bar-shaped groove 921. That is, the eighth ridge 1021 has a width of 200-600 nm, a height of 10-50 nm, and an interval between two adjacent eighth ridges 1021 is 5-50 nm. The eighth ridge 1021 fills in the fourth bar-shaped groove 921.

Figure 3:
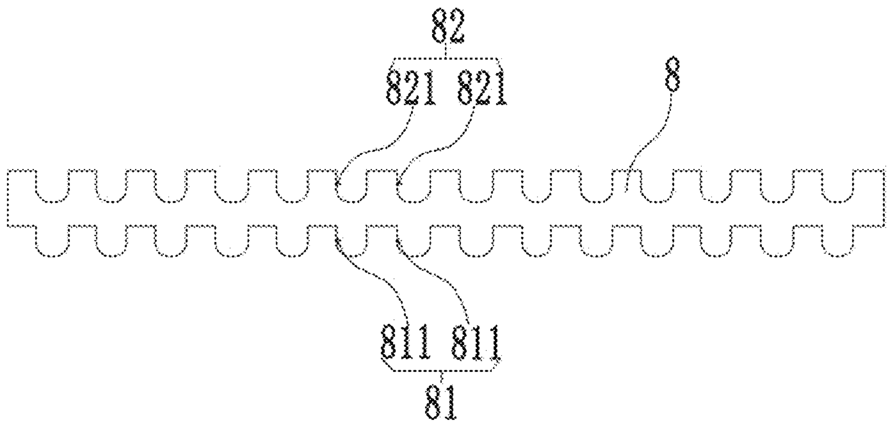
FIG. 3 is a schematic diagram of another structure of the first electrode involved in an embodiment of the present disclosure.
Figure 4:
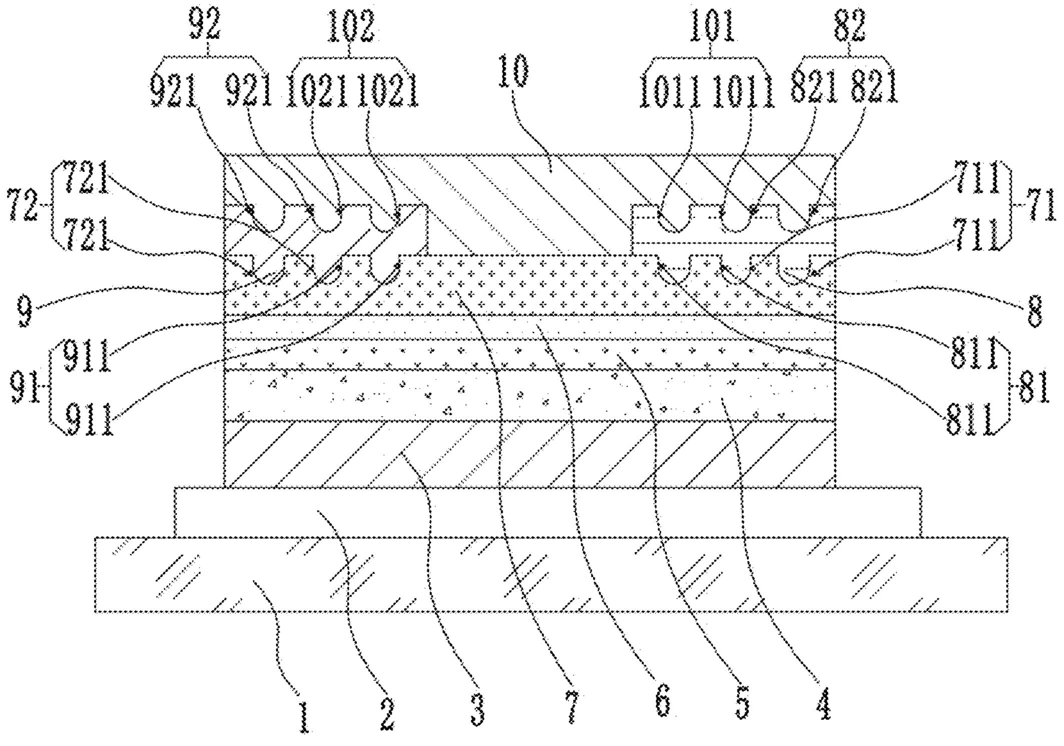
FIG. 4 is a schematic diagram of another structure of the organic light emitting transistor involved in an embodiment of the present disclosure.

As shown in FIG. 3, the cross-sectional shape of the fifth ridge 811 and the second bar-shaped groove 821 may also be curved in a direction perpendicular to the extension direction of the second bar-shaped groove 821. As shown in FIG. 4, the first bar-shaped groove 711 has a curved cross-sectional shape adapted to the cross-sectional shape of the fifth ridge 811, and the sixth ridge 1011 has a curved cross-sectional shape adapted to the cross-sectional shape of the second bar-shaped groove 821. It will be appreciated that the third bar-shaped groove 721 has the same shape as the first bar-shaped groove 711, the seventh ridge 911 has the same shape as the fifth ridge 811, the fourth bar-shaped groove 921 has the same shape as the second bar-shaped groove 821, and the eighth ridge 1021 has the same shape as the sixth ridge 1011, which will not be repeated herein.

In other implementable embodiments, the first micro-nano grating structure 71, the second micro-nano grating structure 82, the third micro-nano grating structure 72 and the fourth micro-nano grating structure 92 may include a plurality of dotted recessed portions arranged in an array. The fifth micro-nano grating structure 81, the sixth micro-nano grating structure 101, the seventh micro-nano grating structure 91 and the eighth micro-nano grating structure 102 have dotted projections in one-to-one correspondence with each of the dotted depressions, with the dotted projections filling in the dotted recessed portions.

It should be noted that the first electrode 8 can be the drain and the second electrode 9 can be the source. The voltage of the first gate 2 can be used by the OLET to control the amount of light emitted by the light emitting layer 6 (EL) of the organic light emitting transistor. The second electrode 9 mainly provides holes and the first electrode 8 mainly provides electrons. The ratio of recombination of the holes injected into the light emitting layer 6 through the second electrode 9 and the electrons injected into the light emitting layer 6 through the first electrode 8 may be controlled by the the electric field of the first gate 2, thus changing the amount of emitted light.

The base substrate 1 can be made from glass, either from silicon wafers or from synthetic resins such as polyethyleneterephthalate (PET), polyethersulfone (PES) or polycarbonated (PC). When the double-sided organic light emitting transistor is prepared, glass is mostly used as the base substrate 1. When the single-sided organic light emitting transistor is s prepared, the silicon wafer is mostly used as the base substrate 1. The first gate 2 usually adopts Indium Tin Oxide (ITO) as the gate. Other conductive oxides can also be used as the gate. The first insulating layer 3 can be inorganic or organic, and the film thickness of the first insulating layer 3 is usually between 20 nm and 2000 nm.

The active layer 4 can be polycrystalline silicon or metal oxide. The film thickness of the active layer 4 is generally between 20 nm-2000 nm. The hole transport layer 5 (HTL), light emitting layer 6 (EML), electron transport layer 7 (ETL) are all materials used in conventional OLED devices. The film thickness of the electron transport layer 7 is 15-50 nm, the film thickness of the light emitting layer 6 is 30-60 nm, and the film thickness of the hole transport layer 5 is 10-30 nm. The first electrode 8 and the second electrode 9 can be made of the same material, e.g. LiF/Al, or Au. The film thickness of both the first electrode 8 and the second electrode 9 can be set as 30-90 nm. The first electrode 8 and the second electrode 9 can also be of different structures. For example, the first electrode 8 is graphene and the second electrode 9 is Al, or the first electrode 8 can be made of $MoO_3$/Au and the second electrode 9 is made of LiF/Al.

The organic light emitting transistor is prepared as follows.

The first gate 2 is provided on the base substrate 1, and the first insulating layer 3 is provided on the first gate 2 generally by means of Plasma Enhanced Chemical Vapor Deposition (PECVD). The electron transport layer 7, light emitting layer 6 and hole transport layer 5 can be prepared by using vacuum vapour deposition or spin coating, printing process, which will not be described in detail here.

After the electron transport layer 7 is deposited, the deposited base substrate 1 is fetched out, the prepared imprint template with the Polydimethylsiloxane (PDMS) material is attached to the electron transport layer 7, and then transferred to the nano-imprinting machine for the imprint process, and then the imprint template is peeled off. At this time, the micro-nano pattern of the imprint template has been completely transferred to the surface of the electron transfer layer 7.

The base substrate 1 is then transferred to a vacuum vapour deposition machine, where the first electrode 8 and the second electrode 9 are deposited at one time on the surface of the electronic transport layer 7 where the micro-nano pattern has been formed. At this time, the micro-nano pattern on the surface of the electronic transport layer 7 can be completely transferred to the first electrode 8 and the second electrode 9. At last, the encapsulation layer 10 is used for encapsulation, which can be laminated inorganic film encapsulation, or can also be laminated inorganic and organic film encapsulation.

Figure 5:
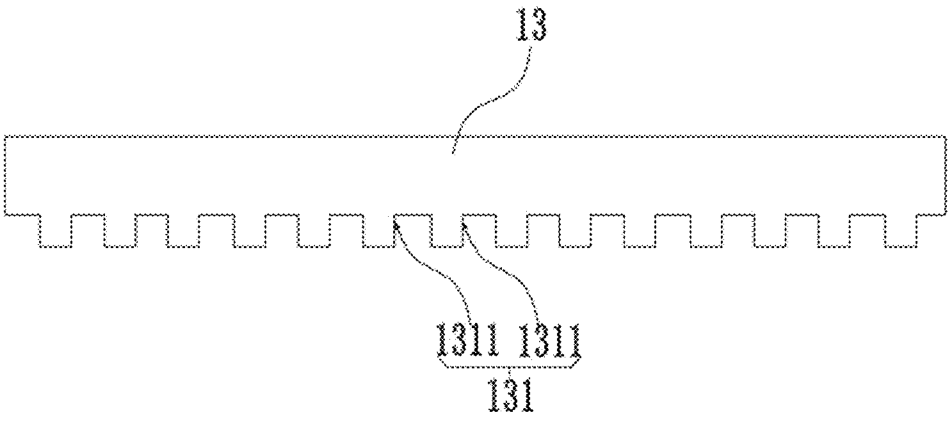
FIG. 5 is a schematic diagram of a structure of an imprint template involved in an embodiment of the present disclosure.

As shown in FIG. 5, the surface of the imprint template 13 is provided with a periodic micro-nano pattern. The micro-nano pattern includes a number of mutually parallel imprint patterns 131. The imprint patterns 131 include mutually parallel strip-shaped imprint grooves 1311. The strip-shaped imprint groove 1311 has the width of 200-600 nm, the depth of 10-50 nm, and the interval between two adjacent strip-shaped imprint grooves 1311 is 5-50 nm.

The imprint template 13 with periodic micro-nano patterns can be prepared by the following process. Specifically, electron beam etching is performed on the silicon template. The micro-nano patterns of different periods of 200-600 nm in width and 10-50 nm in depth and spaced 5-50 nm apart are distributed on the silicon template. After the silicon template is cleaned to remove the photoresist protective layer residue, PDMS solution mixed with the curing agent is applied dropwise, and after the solution is uniformly spread on the silicon template, it is heated and cured in an oven at 95° C. for 10 h. After the curing is completed, the PDMS layer is peeled off. At this time, the imprint template 13 has completed the reproduction of the periodic micro-nano patterns on the silicon template, which can be used for the subsequent imprint process.

Figure 6:
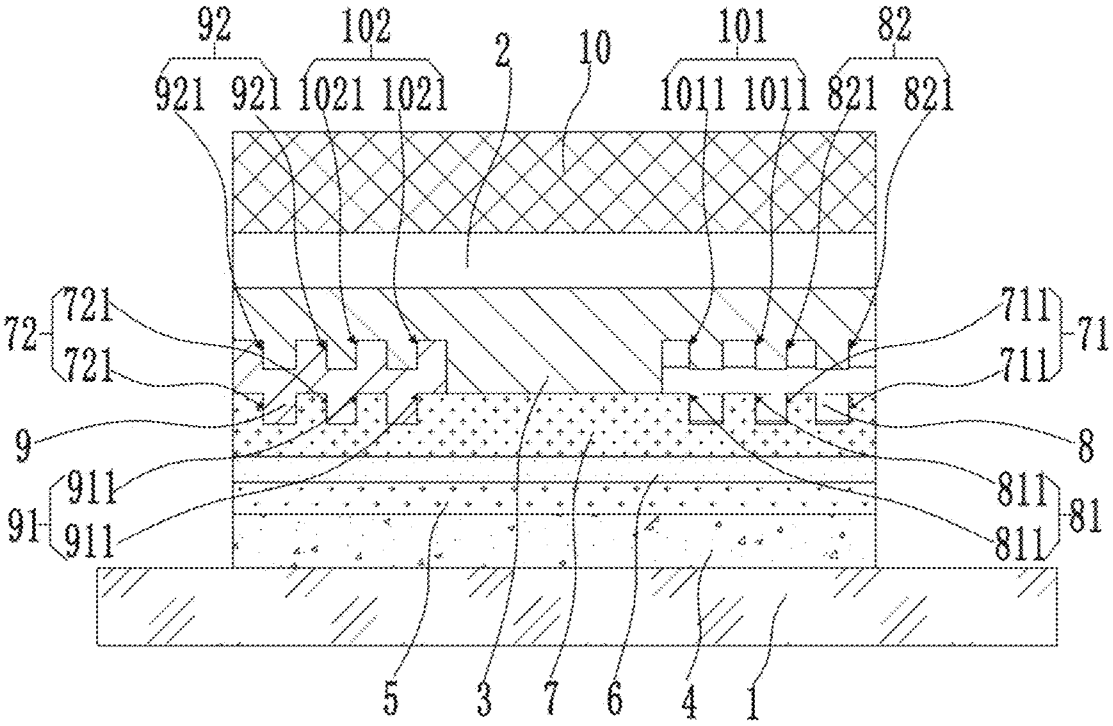
FIG. 6 is a schematic diagram of a further structure of the organic light emitting transistor of an embodiment of the present disclosure.

As shown in FIG. 6, the organic light emitting transistor differs from the organic light emitting transistor shown in FIG. 1 in that the organic light emitting transistor is a top gate type organic light emitting transistor. The active layer 4 is provided on a side of the base substrate 1. The first insulating layer 3 is provided on a side of the first electrode 8 and the second electrode 9 away from the base substrate 1. The first gate 2 is provided on a side of the first insulating layer 3 away from the base substrate 1. The encapsulation layer 10 is provided on a side of the first gate 2 away from the base substrate 1. The sixth micro-nano grating structure 101 and the eighth micro-nano grating structure 102 are spaced on a side of the first insulating layer 3 close to the first electrode 8.

The materials used by the base substrate 1, the active layer 4, the hole transport layer 5, the light emitting layer 6, the electron transport layer 7, the first electrode 8, the second electrode 9, the first insulating layer 3, the first gate 2 and the encapsulation layer 10 of the organic light emitting transistor and the preparation process are basically the same as the organic light emitting transistor shown in FIG. 1, which will not be repeated herein.

Figure 7:
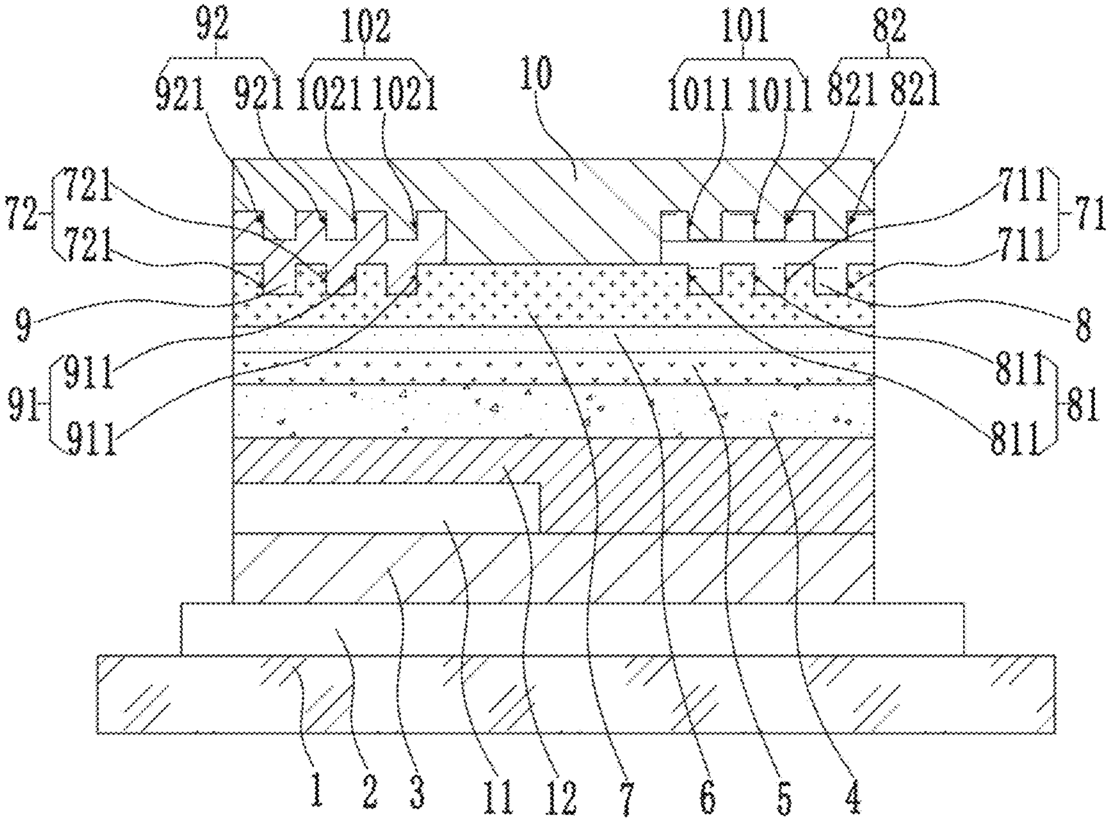
FIG. 7 is a schematic diagram of a further structure of the organic light emitting transistor of an embodiment of the present disclosure.

As shown in FIG. 7, the organic light emitting transistor differs from the organic light emitting transistor shown in FIG. 1 in that the organic light emitting transistor is a double bottom gate type organic light emitting transistor, a second gate 11 is further provided on a side of the first insulating layer 3 away from the base substrate 1, a second insulating layer 12 is provided on a side of the second gate 11 away from the base substrate 1, and an active layer 4 is provided on a side of the second insulating layer 12 away from the base substrate 1. It is also noted that the orthographic projection of the second gate 11 on the base substrate 1 is smaller than the orthographic projection of the first gate 2 on the base substrate 1. Both the first gate 2 and the second gate 11 can control the amount of charges transferred to the radiation recombination region, controlling the balance point where equal charge density at the boundary of the emitting layer is achieved, allowing for optimal operation under the high current.

The material and preparation process used for the second gate 11 is basically the same as for the first gate 2, and the material and preparation process used for the second insulation layer 12 is basically the same as for the first insulation layer 3. The materials used by the base substrate 1, the active layer 4, the hole transport layer 5, the light emitting layer 6, the electron transport layer 7, the first electrode 8, the second electrode 9, the first insulating layer 3, the first gate 2 and the encapsulation layer 10 of the organic light emitting transistor and the preparation process are basically the same as the organic light emitting transistor shown in FIG. 1, which will not be repeated herein.

Figure 8:
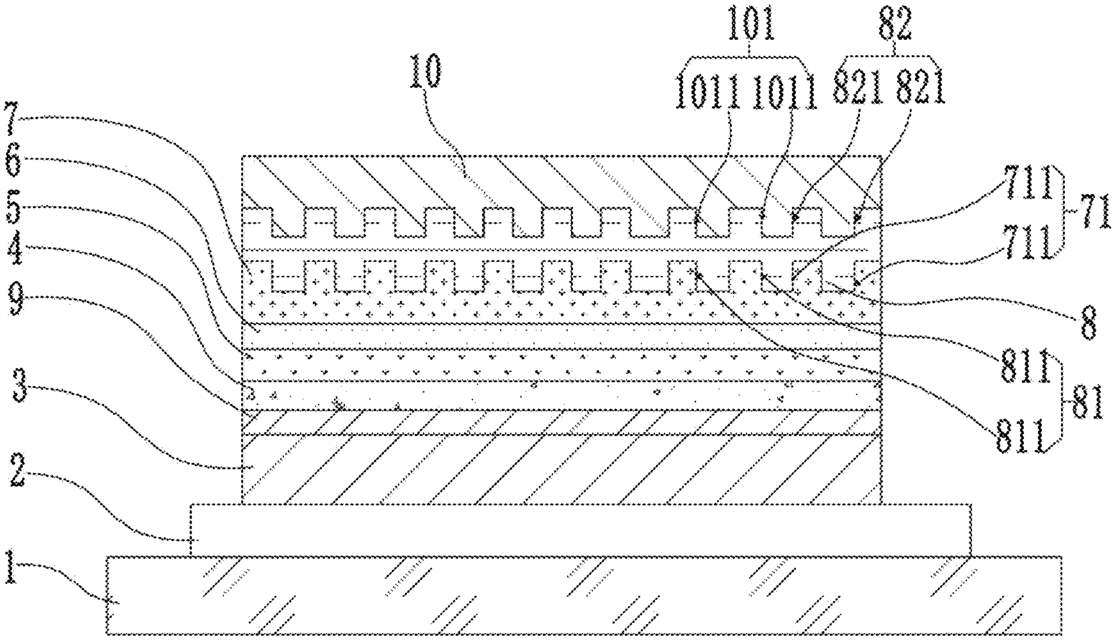
FIG. 8 is a schematic diagram of a further structure of the organic light emitting transistor of an embodiment of the present disclosure.

As shown in FIG. 8, the organic light emitting transistor differs from the organic light emitting transistor shown in FIG. 1 in that the first region is the entire surface of the electron transport layer 7 away from the side of the base substrate 1. The entire surface of the electron transport layer 7 is provided with a first micro-nano grating structure 71. The entire surface of the first electrode 8 close to the side of the base substrate 1 is provided with a fifth micro-nano grating structure 81. The entire surface of the first electrode 8 away from the side of the base substrate 1 is provided with a second micro-nano grating structure 82. The entire surface of the encapsulation layer 10 close to the side of the base substrate 1 is provided with a sixth micro-nano grating structure 101. The second electrode 9 is provided between the first insulating layer 3 and the active layer 4, and the side of the second electrode 9 away from the base substrate 1 is planar. The materials used by the base substrate 1, the active layer 4, the hole transport layer 5, the light emitting layer 6, the electron transport layer 7, the first electrode 8, the second electrode 9, the first insulating layer 3, the first gate 2 and the encapsulation layer 10 of the organic light emitting transistor and the preparation process are basically the same as the organic light emitting transistor shown in FIG. 1, which will not be repeated herein.

Figure 9:
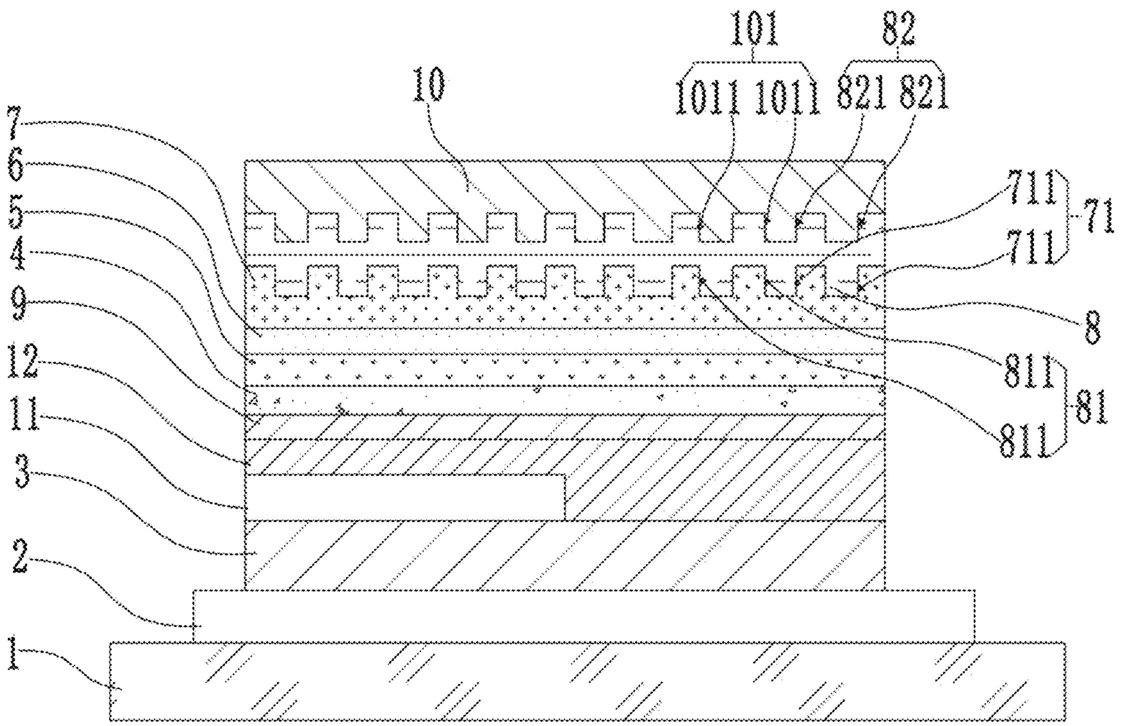
FIG. 9 is a schematic diagram of a further structure of the organic light emitting transistor of an embodiment of the present disclosure.

As shown in FIG. 9, the organic light emitting transistor differs from the organic light emitting transistor shown in FIG. 8 in that a second gate 11 is further provided on a side of the first insulating layer 3 away from the base substrate 1, a second insulating layer 12 is provided on a side of the second gate 11 away from the base substrate 1, and a second electrode 9 is provided on a side of the second insulating layer 12 away from the base substrate 1. The material and preparation process of the second gate 11 may be the same as the material and preparation process of the first gate 2, and the material and preparation process of the second insulating layer 12 may be the same as the material and preparation process of the first insulating layer 3.

The embodiments of the present disclosure provide a display apparatus including any of the above display panels of the present disclosure. The structure of the display panel has been described in detail above, and therefore will not be repeated here. The beneficial effects of the display apparatus may also be referred to the beneficial effects of the display panel.

The display apparatus can be used in conventional electronic devices, such as mobile phones, computers, televisions and camcorders, which may also be in emerging wearable devices, such as virtual reality devices and augmented reality devices, which will not be listed one by one herein.

It should be noted that the display apparatus includes, in addition to the display panel, other necessary parts and components, for example, the housing, the power cable, etc., which can be added to accordingly by a person skilled in the art according to the specific usage requirements of the display apparatus, and which will not be repeated herein.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative only, and the real scope and spirit of the present disclosure is defined by the appended claims.

What is claimed is:

1. An organic light emitting transistor, comprising:

a base substrate;

an active layer, provided on a side of the base substrate;

a hole transport layer, provided on a side of the active layer away from the base substrate;

a light emitting layer, provided on a side of the hole transport layer away from the base substrate;

an electron transport layer, provided on a side of the light emitting layer away from the base substrate, wherein at least part of a first micro-nano grating structure is provided on a side of the electron transport layer away from the base substrate;

a first electrode, provided on the side of the electron transport layer away from the base substrate, wherein at least part of a second micro-nano grating structure is provided on a side of the first electrode away from the base substrate, an orthographic projection of the second micro-nano grating structure on the base substrate is located within an orthographic projection of the first micro-nano grating structure on the base substrate, wherein a first region and a second region spaced apart are provided on the side of the electron transport layer away from the base substrate, the first micro-nano grating structure is located in the first region, the first electrode is provided on the first micro-nano grating structure, the second region is provided with a third micro-nano grating structure, the organic light emitting transistor further comprises:

a second electrode, provided on the third micro-nano grating structure, wherein a fourth micro-nano grating structure is provided on a side of the second electrode away from the base substrate, an orthographic projection of the fourth micro-nano grating structure on the base substrate is located within an orthographic projection of the third micro-nano grating structure on the base substrate.

2. The organic light emitting transistor according to claim 1, wherein a region of the electron transport layer away from the side of the base substrate and located between the first electrode and the second electrode is a planar region.

3. The organic light emitting transistor according to claim 2, further comprising:

a first gate, provided between the base substrate and the active layer, wherein a first insulating layer is provided between the first gate and the active layer.

4. The organic light emitting transistor according to claim 3, further comprising:

a second gate, provided between the first insulating layer and the active layer, wherein a second insulating layer is provided between the second gate and the active layer.

5. The organic light emitting transistor according to claim 4, further comprising:

an encapsulation layer, provided on a side of the first electrode and the second electrode away from the base substrate, wherein the encapsulation layer is partially located on the second micro-nano grating structure, partially located on the fourth micro-nano grating structure, and partially located on a planar region of the electron transport layer.

6. The organic light emitting transistor according to claim 3, further comprising:

an encapsulation layer, provided on the side of the first electrode and the second electrode away from the base substrate, wherein the encapsulation layer is partially located on the second micro-nano grating structure, partially located on the fourth micro-nano grating structure, and partially located on a planar region of the electron transport layer.

7. The organic light emitting transistor according to claim 2, further comprising:

a first gate, provided on a side of the second electrode and the first electrode away from the base substrate, wherein a first insulating layer is provided between the first gate and the second electrode, the first electrode, the first insulating layer is partially provided on the second micro-nano grating structure, partially provided on the fourth micro-nano grating structure and partially provided on a planar region of the electron transport layer.

8. The organic light emitting transistor according to claim 7, further comprising:

an encapsulation layer, provided on a side of the first gate away from the base substrate and in contact with the first gate.

9. The organic light emitting transistor according to claim 1, wherein the first micro-nano grating structure, the second micro-nano grating structure, the third micro-nano grating structure and the fourth micro-nano grating structure are all periodic micro-nano grating structures, the periodic micro-nano grating structure comprises a plurality of mutually parallel bar-shaped grooves, widths of the bar-shaped grooves are equal and intervals between two adjacent grooves are equal.

10. The organic light emitting transistor according to claim 9, wherein the bar-shaped groove has a rectangular or curved cross-sectional shape along a direction perpendicular to an extension direction of the bar-shaped groove.

11. The organic light emitting transistor according to claim 10, wherein in response to that the bar-shaped groove has a rectangular cross-sectional shape, the bar-shaped groove has a width of 200-600 nm and a depth of 10-50 mm, and the interval between two adjacent bar-shaped grooves is 5-50 nm.

12. The organic light emitting transistor according to claim 1, wherein the first micro-nano grating structure, the second micro-nano grating structure, the third micro-nano grating structure and the fourth micro-nano grating structure are all periodic micro-nano grating structures, the periodic micro-nano grating structure comprises a plurality of dotted recessed portions arranged in an array.

13. A method of preparing an organic light emitting transistor, comprising:

providing a base substrate;

forming an active layer on a side of the base substrate;

forming a hole transport layer on a side of the active layer away from the base substrate;

forming a light emitting layer on a side of the hole transport layer away from the base substrate;

forming an electron transport layer on a side of the light emitting layer away from the base substrate;

forming at least part of a first micro-nano grating structure on a side of the electron transport layer away from the base substrate; and forming a first electrode in a region of the electron transport layer provided with the first micro-nano grating structure, wherein at least part of a second micro-nano grating structure is provided on a side of the first electrode away from the base substrate, an orthographic projection of the second micro-nano grating structure on the base substrate is located within an orthographic projection of the first micro-nano grating structure on the base substrate, providing a first region and a second region spaced apart on the side of the electron transport layer away from the base substrate, wherein the first micro-nano grating structure is located in the first region, the first electrode is provided on the first micro-nano grating structure, the second region is provided with a third micro-nano grating structure, providing a second electrode on the third micro-nano grating structure, wherein a fourth micro-nano grating structure is provided on a side of the second electrode away from the base substrate, an orthographic projection of the fourth micro-nano grating structure on the base substrate is located within an orthographic projection of the third micro-nano grating structure on the base substrate.

14. A display panel, comprising an organic light emitting transistor, wherein the organic light emitting transistor comprises:

a base substrate:

an active layer, provided on a side of the base substrate;

a hole transport layer, provided on a side of the active layer away from the base substrate;

a light emitting layer, provided on a side of the hole transport layer away from the base substrate;

an electron transport layer, provided on a side of the light emitting layer away from the base substrate, wherein at least part of a first micro-nano grating structure is provided on a side of the electron transport layer away from the base substrate;

a first electrode, provided on the side of the electron transport layer away from the base substrate, wherein at least part of a second micro-nano grating structure is provided on a side of the first electrode away from the base substrate, an orthographic projection of the second micro-nano grating structure on the base substrate is located within an orthographic projection of the first micro-nano grating structure on the base substrate, wherein a first region and a second region spaced apart are provided on the side of the electron transport layer away from the base substrate, the first micro-nano grating structure is located in the first region, the first electrode is provided on the first micro-nano grating structure, the second region is provided with a third micro-nano grating structure, the organic light emitting transistor further comprises:

a second electrode, provided on the third micro-nano grating structure, wherein a fourth micro-nano grating structure is provided on a side of the second electrode away from the base substrate, an orthographic projection of the fourth micro-nano grating structure on the base substrate is located within an orthographic projection of the third micro-nano grating structure on the base substrate.

15. A display apparatus, comprising the display panel of claim 14.

* * * * *